United States Patent
Kerner et al.

(10) Patent No.: US 10,263,624 B2
(45) Date of Patent: Apr. 16, 2019

(54) PHASE SYNCHRONIZATION BETWEEN TWO PHASE LOCKED LOOPS

(71) Applicant: Intel IP Corporation, Santa Clara, CA (US)

(72) Inventors: Michael Kerner, Tel Mond (IL); Elan Banin, Raanana (IL); Yair Dgani, Raanana (IL); Evgeny Shumaker, Nesher (IL); Danniel Nahmanny, Givat Shapira (IL); Gil Horovitz, Emek-Hefer (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/634,183

(22) Filed: Jun. 27, 2017

(65) Prior Publication Data

US 2018/0375519 A1 Dec. 27, 2018

(51) Int. Cl.
*H03L 7/00* (2006.01)
*H03L 7/087* (2006.01)
*G04F 10/00* (2006.01)

(52) U.S. Cl.
CPC ............ *H03L 7/087* (2013.01); *G04F 10/005* (2013.01)

(58) Field of Classification Search
None
See application file for complete search history.

(56) References Cited

U.S. PATENT DOCUMENTS

| | | | |
|---|---|---|---|
| 5,502,711 A * | 3/1996 | Clark | G11B 20/1423 360/51 |
| 6,469,550 B1 | 10/2002 | Kurd | |
| 7,948,326 B2 * | 5/2011 | Ortler | G01R 35/005 331/14 |
| 8,406,366 B2 | 3/2013 | Hattori et al. | |
| 9,116,769 B2 * | 8/2015 | Staszewski | G06F 9/30032 |
| 9,148,277 B2 * | 9/2015 | Pyeon | G06F 13/1689 |
| 9,225,507 B1 | 12/2015 | Lye et al. | |
| 9,479,182 B1 * | 10/2016 | Baidas | H03L 7/07 |
| 2006/0001494 A1 * | 1/2006 | Garlepp | H03L 7/0998 331/2 |
| 2006/0077297 A1 * | 4/2006 | Sonobe | H03L 7/07 348/536 |
| 2007/0254600 A1 | 11/2007 | Ishii | |
| 2008/0069286 A1 * | 3/2008 | Staszewski | G06F 1/04 375/376 |

(Continued)

OTHER PUBLICATIONS

Extended European Search Report dated Nov. 2, 2018 for European Patent Application 18174451.7.

*Primary Examiner* — Lincoln D Donovan
*Assistant Examiner* — Khareem E Almo
(74) *Attorney, Agent, or Firm* — Eschweiler & Potashnik, LLC

(57) ABSTRACT

Systems, methods, and circuitries for synchronizing a first phase locked loop (PLL) with a second PLL are provided. In one example a PLL system includes a first PLL configured to generate a first signal; a second PLL configured to generate a second signal; and phase calculation circuitry. The phase calculation circuitry is configured to calculate a phase of the first signal at a given time; and provide the calculated phase to the second PLL for use by the second PLL in synchronizing a phase of the second with the phase of the first signal.

17 Claims, 3 Drawing Sheets

(56) References Cited

U.S. PATENT DOCUMENTS

| | | | | |
|---|---|---|---|---|
| 2011/0175653 A1* | 7/2011 | Tani | ............................ | G06F 1/06 |
| | | | | 327/156 |
| 2015/0084676 A1* | 3/2015 | McLaurin | ............... | H03L 7/085 |
| | | | | 327/142 |
| 2017/0324419 A1* | 11/2017 | Mayer | ................... | H03L 7/0891 |

* cited by examiner

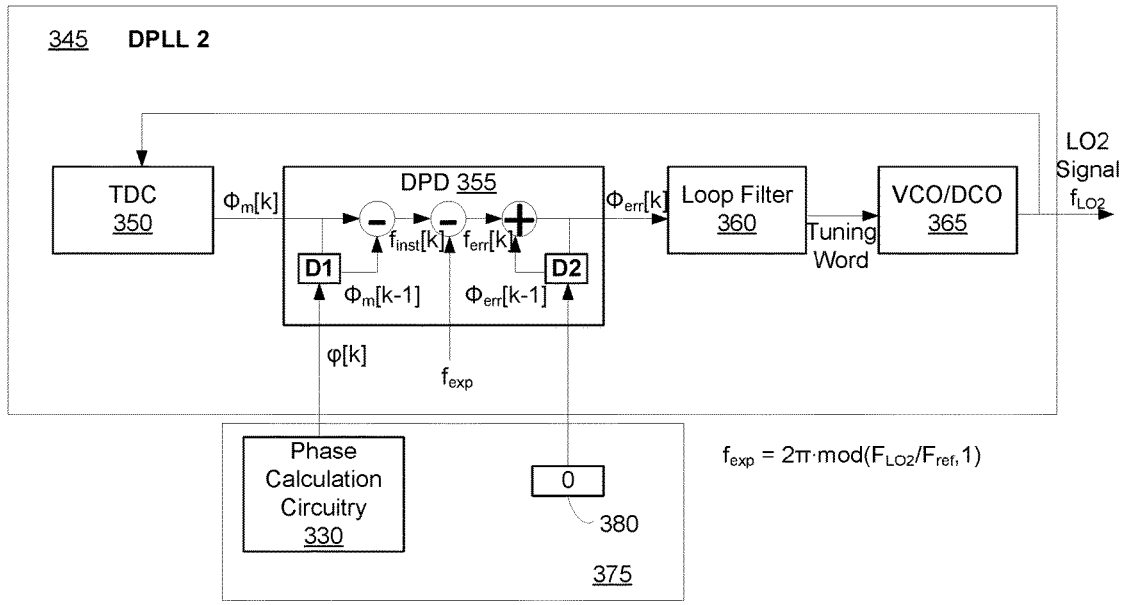
FIG. 3
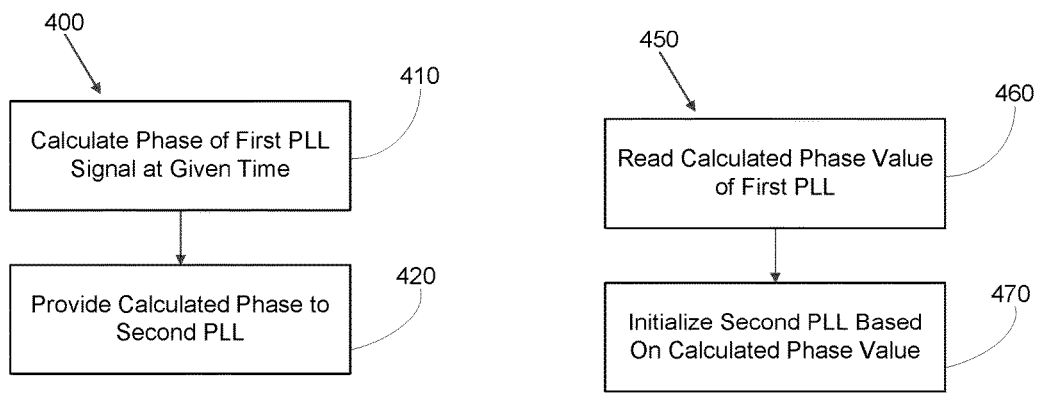
FIG. 4A
FIG. 4B

PHASE SYNCHRONIZATION BETWEEN TWO PHASE LOCKED LOOPS

BACKGROUND

Phase locked loops (PLLs) can provide precise generation and alignment of timing for a wide variety of applications, such as for clock generation or clock data recovery. In digital phase-locked loops (DPLLs) a digital loop filter is utilized to replace analog components. All-digital phase locked loops (ADPLLs) are designed to utilize digital techniques throughout and can comprise a phase frequency detector, a loop filter, an oscillator, and a frequency divider.

BRIEF DESCRIPTION OF THE DRAWINGS

FIG. 3 illustrates an exemplary PLL system that includes two PLLs and synchronization circuitry that synchronizes the two PLLs on demand in accordance with various aspects described.

FIGS. 4A and 4B illustrate flow diagrams of an exemplary methods for synchronizing a second PLL with a first PLL in accordance with various aspects described.

DETAILED DESCRIPTION

Figure 1:
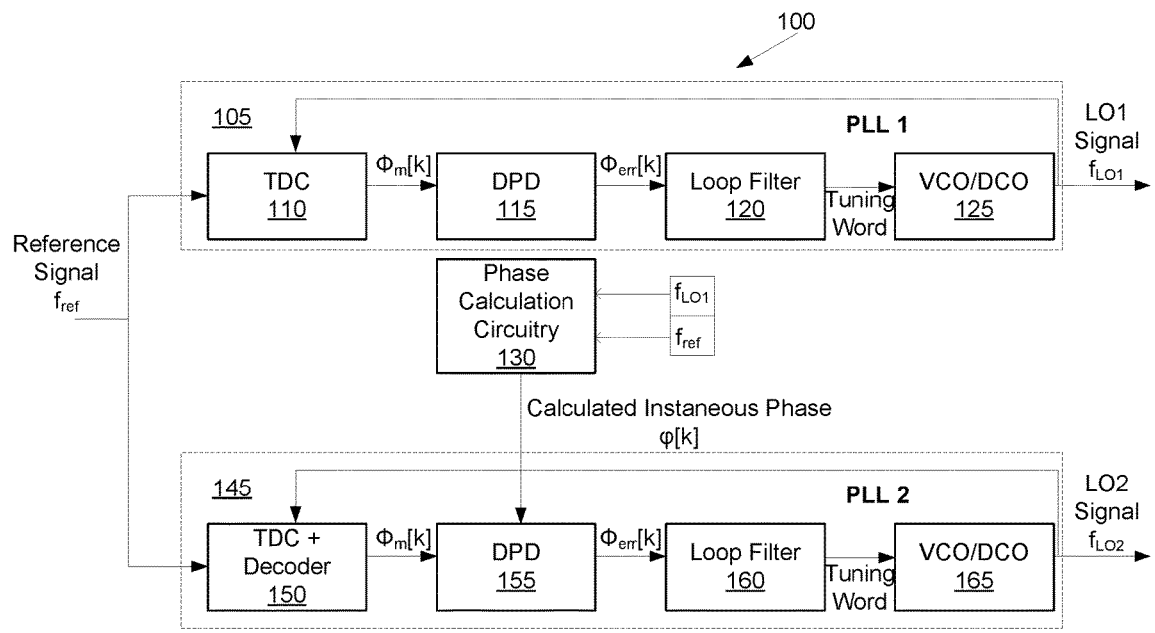
FIG. 1 illustrates an exemplary PLL system that includes two PLLs and a phase calculation circuitry that facilitates synchronization of the two PLLs in accordance with various aspects described.

DPLLs provide a low-power-small-area solution relative to analog PLLs. In a DPLL the phase offset between the local oscillator (LO) signal and the reference clock signal is measured by an analog-to-digital convertor called a time-to-digital converter (TDC). The measured phase is then compared to an expected phase and the result is used to correct the LO frequency. Synchronizing two PLLs to the same frequency and phase can be useful for many implementations. While it is sufficient (and necessary) to use the same reference clock to synchronize the frequency of the two PLLs, synchronizing the phases of the two PLLs is more complicated. This is because the instantaneous phase of a PLL changes with every sampling clock (for non-integer frequencies), and the instantaneous phase of a PLL can only be measured with the addition of reference-noise and quantization-noise. This means that using a direct measurement of one PLL's phase for use by another PLL in synchronizing will not be effective.

The start up condition of DPLLs may be manipulated by changing the initial values used by the DPLL at start up (e.g., values stored in a register that is accessed by the DPLL). Often, the initial values are chosen without any basis on the measured or expected phase of the other DPLL(s). For example, the initial value may be set to zero or is a random number. Systems and methods described herein address the problem of momentary or on-demand synchronization of two PLLs by calculating (rather than measuring) an instantaneous phase of a first PLL and providing the calculated instantaneous phase to a second PLL to use as an initial value in synchronizing with the first PLL.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

FIG. 1 illustrates one example of a PLL system 100 that includes a first PLL 105 and a second PLL 145 and exemplary phase calculation circuitry 130. For the purposes of this description, the phase locked loop systems will be described as digital phase locked loops. However, the described systems and methods may also be applied to analog PLLs, ADPLLs, and so on. Further, while two PLLs are illustrated in FIG. 1, any number of PLLs may be synchronized using the described techniques. The first PLL 105 is set to generate a first signal "LO1" that has a target frequency $f_{LO1}$ from a reference signal (e.g., a reference clock output) having a reference frequency $f_{ref}$. The second PLL 145 is set to generate a second signal "LO2" that has a target frequency $f_{LO2}$ that is different from the reference signal. Each PLL includes a TDC 110/150, a digital phase detector (DPD) 115/155, a loop filter 120/160, and an oscillator (voltage controlled oscillator (VCO) or digitally controlled oscillator (DCO)) 125/165.

For the sake of brevity, the general functioning of the components of the first PLL 105 will be outlined and it is to be understood that the analogous components in the second PLL 145 function in the same manner. The TDC 110 determines a difference between the first signal LO1 and the reference signal and outputs the difference as a measured phase $\varphi_m[k]$ of the first signal. The DPD 115 compares the measured phase $\varphi_m[k]$ with an expected phase to determine a phase error $\varphi_{err}[k]$ of the first signal LO1. The loop filter 120 smooths the phase error to generate a tuning word that adjusts the oscillator 125 to minimize the phase error.

The PLL system 100 includes phase calculation circuitry 130 that calculates an "instantaneous" phase $\varphi[k]$ of the first signal LO1 at some given time k (where k corresponds to a number of ref signal counts since a last reset time). The phase calculation circuitry 130 provides the calculated instantaneous phase to the second PLL 145 when the second PLL starts so that the second PLL can synchronize with the first PLL. The instantaneous phase is provided to the second PLL 145 by, for example, storing a value of the instantaneous phase in memory or a register accessible to the second PLL or otherwise communicating the value to the second PLL for use at start up. While in FIG. 1, the phase calculation circuitry 130 calculates an instantaneous phase of the first PLL 105, in other examples, the phase calculation circuitry 130 may calculate the phase of the second PLL 145 for use by the first PLL 105 or additional calculation circuitries may be provided that calculate the instantaneous phase of several different PLLs.

The calculation of an instantaneous phase of the first PLL 105 for use by the second PLL 145 upon start up allows for quick, on-demand or momentary, synchronization of two PLLs which is beneficial in many systems. For example, in some communication systems, there may be several 60 GHz transceivers that are employed for beamforming. When one of the transceivers becomes desynchronized (e.g. due to automatic gain control (AGC)), it is important that the transceiver is quickly resynchronized with the remaining transceivers. This can be achieved by the phase calculation circuitry 130 calculating and providing an instantaneous phase of one of the remaining (in-sync) transceivers.

Figure 2:
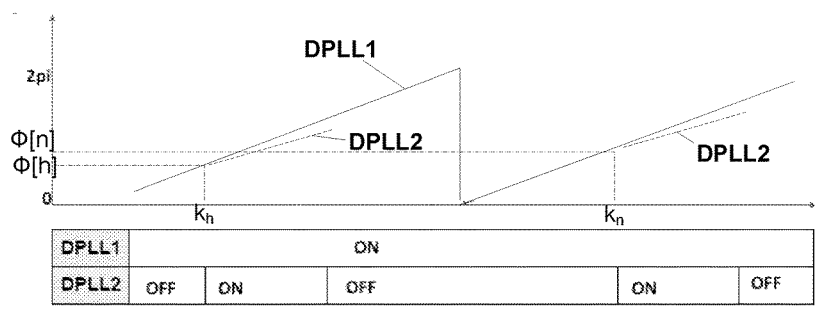
FIG. 2 is a diagram illustrating the phase of a first PLL signal and a second PLL signal that are aligned utilizing the phase calculation circuitry of FIG. 1.

FIG. 2 is a diagram that illustrates how the instantaneous phase calculated by the phase calculation circuitry 130 is used to synchronize the phases of the first signal LO1 and the second signal LO2 when the second PLL operates intermittently. This type of intermittent operation of a PLL is becoming more common. In one example, during Wi-Fi/long term evolution (LTE) coexistence Wi-Fi is an aggressor and LTE is a victim. This means that the LTE DPLL is turned off between consecutive Rx sub-frames. In order to re-use the self-interference cancellation (SIC) coefficients from the previous sub-frame, the LTE DPLL should be synchronized to the phase of the Wi-Fi DPLL in every sub-frame (immediately after turn-on of LTE DPLL). FIG. 2 illustrates an output phase of a first DPLL in solid line and the second DPLL in dashed line. The first DPLL operates continuously (e.g., as Wi-Fi DPLL) while the second DPLL is briefly turned on at time $k_h$ and again at time $k_n$. Each time the second DPLL turns on, the second DPLL accesses or receives the instantaneous phase of the first DPLL calculated by the phase calculation circuitry 130 (e.g., $\varphi[h]$ for time $k_h$ and $\varphi[n]$ for time $k_n$).

Quick synchronization of two DPLLs is also important in DPLL systems that switch between a low-performance DPLL that consumes relatively little power and a high performance DPLL that provides very low phase noise. The DPLL system may use the low-performance DPLL except when a data portion of a frame is being transmitted or received. During transmission or reception, the high-performance DPLL may be switched on and used. The high-performance DPLL should immediately be synchronized with the low-performance DPLL to avoid performance degradation. In any of these use cases, the PLL system 100 allows the second PLL to synchronize with the first PLL on demand using the instantaneous phase calculated by the phase calculation circuitry 130. While in FIG. 1, only a single phase calculation circuitry is illustrated, multiple such circuitries may be used, and associated with additional PLLs.

The phase calculation circuitry 130 calculates, rather than measures, the instantaneous phase of the first signal LO1 at a given time k. One way that the phase calculation circuitry 130 can calculate the instantaneous phase of the first signal is based on the slope of a phase ramp that is determined by the DPD 115. FIG. 3 illustrates an example DPLL 345 that is synchronized using a measured instantaneous phase value $\varphi[k]$. The DPLL 345 includes DPD 355 that generates the phase error $\varphi_{err}[k]$ that is smoothed by loop filter 360 to become a tuning word for an oscillator 365. The inputs of the DPD 355 are $\varphi_m[k]$, the output of a TDC 350 that is the measured phase of the LO2 signal with respect to the reference signal, and a nominal or expected frequency $f_{exp}$ of the LO2 signal. The expected frequency may be expressed in terms of a ratio (called the fractional configuration) of the nominal frequency to the frequency of the reference signal (e.g., the slope of the phase ramp). For example, if the frequency of the reference signal is 100 MHz and the nominal frequency of the LO2 signal is 1.01 GHz, then $f_{exp}$ would be 10.1.

The DPD 355 includes two loops that combine a prior phase or phase error value with a present value to perform a differentiation or integration operation. In the first loop, a buffer or register D1 stores a prior value of the measured phase $\varphi_m[k-1]$ that is subtracted from a present value of the measured $\varphi_m[k]$ to calculate $f_{inst}$, which is the measured instantaneous frequency. The frequency error $f_{err}[k]$ is calculated as the difference between $f_{inst}$ and $f_{exp}$. Buffer or register D2 stores a prior value of the phase error $\varphi_{err}[k-1]$ that is added to the frequency error to calculate the phase error $\varphi_{err}[k]$ that is the output of the DPD 355. The calculation made by the DPD 355 is:

$$\varphi_{err}[k]=\varphi_{err}[k-1]+f_{inst}-f_{exp}=\varphi_{err}[k-1]+\varphi_m[k]-\varphi_m[k-1]-f_{exp} \qquad \text{EQ 1}$$

EQ 1 can be reduced to:

$$\varphi_{err}[k]=\varphi_{err}[k-1]+\varphi_m[k]-\varphi_m[k-1]-f_{exp}=\Sigma_1^k(\varphi[k]-\varphi[k-1]-f_{exp}) \rightarrow$$

$$\varphi_m[k]-\varphi_m[0]+k\cdot f_{exp} \qquad \text{EQ 2}$$

The steady state closed loop of the DPLL 345 keeps $\varphi_{err}[k]$ close to zero, therefore the instantaneous phase of DPLL2 is locked around:

$$i.\ \varphi_{err}[k]\approx 0 \rightarrow \varphi_m[k]\approx \varphi_m[0]+k\cdot f_{exp} \qquad \text{EQ3}$$

In order to synchronize a second PLL to a first PLL, the second PLL should lock onto the instantaneous phase of the first PLL. Synchronization circuitry 375 accomplishes this phase locking by, at the start up time [k] of the second DPLL, setting the phase-error accumulation ($\varphi_{err}[k-1]$ of the second loop in DPD 355) to zero and the previous phase value ($\varphi_m[k-1]$ of the first loop) to the desired instantaneous phase of a first DPLL (not shown). The instantaneous phase is the calculated instantaneous phase $\varphi[k]$ generated by phase calculation circuitry 330. The synchronization circuitry 375 causes the $\varphi[k]$ and 0 to be stored in D1, D2, respectively when the second DPLL 345 initializes at start up. The synchronization circuitry 375 may transfer the values into buffers or registers D1, D2 in response to the second DPLL receiving a start up command or otherwise communicate the values for use at initialization to the second DPLL.

As already outlined with reference to FIG. 1, the phase calculation circuitry 330 calculates the instantaneous phase of the first DPLL at time k according to:

$$\varphi[k]=\text{mod}(\varphi[0]=k\cdot f_{exp}, 2\pi)$$

where $\varphi[0]$ is the initial phase of the first DPLL that is recorded by the first DPLL at reset, $f_{exp}$ is the fractional configuration of the first DPLL, and k is the number of reference clock cycles since a last reset which is the start of the loop locking process where the phase error is set to zero.

FIG. 4A illustrates a flow diagram outlining one embodiment of a method 400 configured to synchronize a first phase locked PLL with a second PLL. The method 400 may be performed by calculation circuitry 130, 330 of FIGS. 1 and 3, respectively. The method includes, at 410, calculating a phase of a first signal at a given time with respect to a reference signal, wherein the first signal is generated by the first PLL. At 420 the calculated phase of the first signal at the given time is provided to the second PLL for use by the second PLL in synchronizing a phase of a second signal generated by the second PLL with the first signal.

FIG. 4B illustrates a flow diagram outlining one embodiment of a method 450 configured to synchronize a first PLL with a second PLL in response to receiving an instruction to start up the second PLL at a given time. The method 450 may be performed by a second PLL 145, 345 of FIGS. 1 and 3, respectively. The method includes, at 460, reading an instantaneous phase value. The instantaneous phase value is based on a calculated phase at the given time of the first PLL. The method includes, at 470, initializing the second PLL based at least on the instantaneous phase value.

It can be seen from the foregoing description that calculating an instantaneous phase of a first DPLL and providing the instantaneous phase to a second DPLL when the second DPLL starts up allows the second DPLL to quickly synchronize with the first DPLL. Since the instantaneous phase is calculated, rather than measured, there is no noise in the instantaneous phase used by the second DPLL, improving phase synchronization accuracy.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Figure 5:
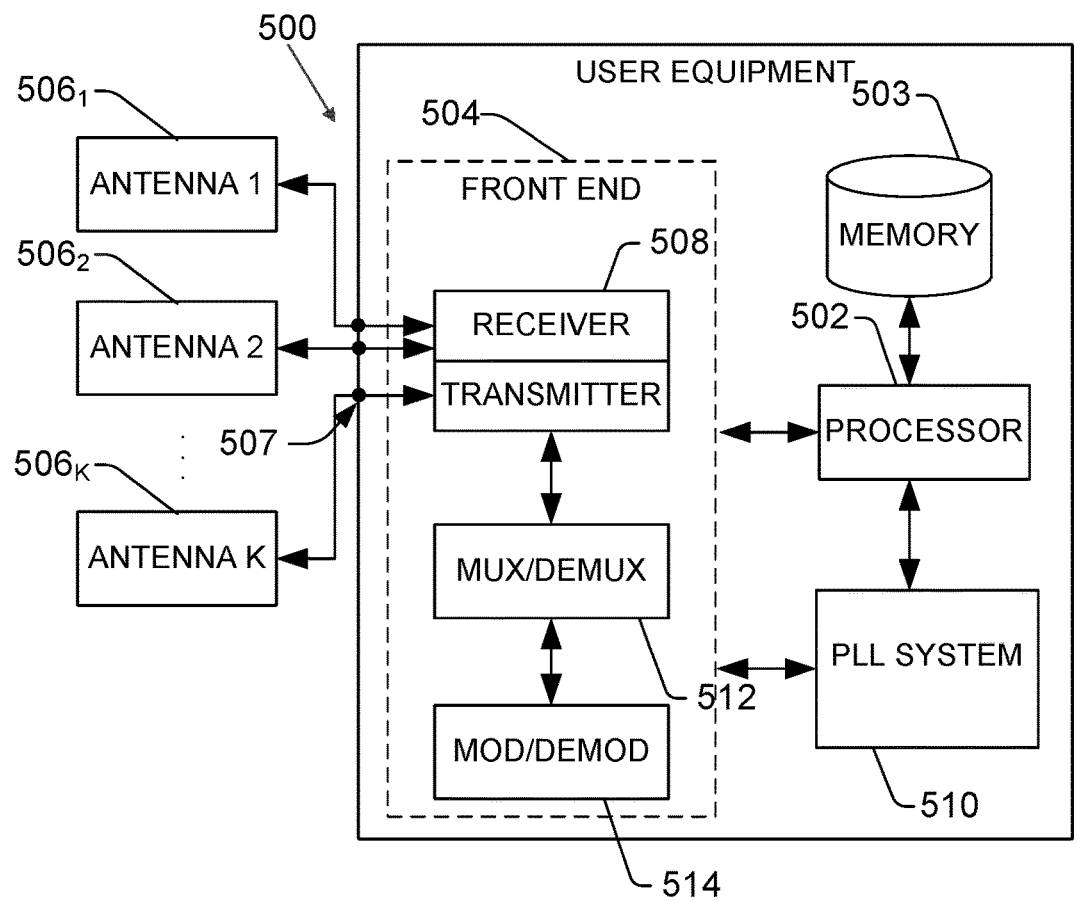
FIG. 5 illustrates an example user equipment device that includes a PLL system that includes phase calculation circuitry and/or synchronization circuitry in accordance with various aspects described.

To provide further context for various aspects of the disclosed subject matter, FIG. 5 illustrates a block diagram of an embodiment of user equipment 500 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 500 can be utilized with one or more aspects of the PLLs devices described herein according to various aspects. The user equipment device 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and so forth, which can operate within a radio access network or other communication network generated via a network device (not shown).

The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters (e.g. transceivers) 508, a mux/demux component 512, and a mod/demod component 514. The front end 504 is coupled to the digital baseband processor 502 and the set of antenna ports 507, in which the set of antennas 5061 to 906k can be part of the front end. In one aspect, the user equipment device 500 can comprise a phase locked loop system 510 that include the phase calculation circuitry 130, 330 and the synchronization circuitry 375 of FIGS. 1 and 3.

The processor 502 can confer functionality, at least in part, to substantially any electronic component within the mobile communication device 500, in accordance with aspects of the disclosure. As an example, the processor 500 can be configured to execute, at least in part, executable instructions that compute the instantaneous phase of the phase locked loop system 510. Thus the processor 500 may embody various aspects of the phase calculation circuitry 130, 330 and the synchronization circuitry 375 of FIGS. 1 and 3.

The processor 502 is functionally and/or communicatively coupled (e.g., through a memory bus) to memory 503 in order to store or retrieve information necessary to operate and confer functionality, at least in part, to communication platform or front end 504, the phase locked loop system 510 and substantially any other operational aspects of the phase locked loop system 510. The phase locked loop system 510 includes at least one oscillator (e.g., a VCO, DCO or the like) that can be calibrated via core voltage, a coarse tuning value, signal, word or selection process according the various aspects described herein. The phase locked loop system 510 includes the features and aspects of the PLL systems 100 and/or 300 of FIGS. 1 and 3, respectively.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, interpacket times, etc. The processor 502 may embody the phase calculation circuitry (130, 330, of FIGS. 1 and 3, respectively) and perform stored instructions that calculate the instantaneous phase value. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 503 may include a static random access memory (SRAM) that stores various parameters used for PLL tuning and/or the calculated instantaneous phase value (e.g., as calculated by the phase calculation circuitry of FIGS. 1 and 3).

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a method to synchronize a first phase locked loop (PLL) with a second PLL. The method includes calculating a phase of a first signal at a given time, wherein the first signal is generated by the first PLL; and providing the calculated phase of the first signal at the given time to the second PLL for use by the second PLL in synchronizing a phase of a second signal generated by the second PLL with the first signal.

Example 2 includes the subject matter of example 1, including or omitting optional elements, including calculating the phase of the first signal at the given time independent of a measured phase of the first signal.

Example 3 includes the subject matter of examples 1-2, including or omitting optional elements, including calculating the phase of the first signal based at least on a ratio between a target frequency of the first signal and a frequency of a reference signal.

Example 4 includes the subject matter of example 3, including or omitting optional elements, including calculating the phase of the first signal at the given time by: determining an initial phase of the first signal with respect to a reference signal at a reset time; determining a phase offset by multiplying the ratio by a number of reference signal cycles occurring between the reset time and the given time; and adding the initial phase to the phase offset.

Example 5 includes the subject matter of examples 1-2, including or omitting optional elements, including storing the calculated phase of the first signal at the given time in a register that is read by the second PLL upon start up.

Example 6 is a method to synchronize a first phase locked loop (PLL) with a second PLL in response to receiving an instruction to start up the second PLL at a given time. The method includes reading an instantaneous phase value, wherein the instantaneous phase value corresponds to a calculated phase at the given time of the first PLL; and initializing the second PLL based at least on the instantaneous phase value.

Example 7 includes the subject matter of example 6, including or omitting optional elements, including accessing a register to read the instantaneous phase value.

Example 8 includes the subject matter of examples 6-7, including or omitting optional elements, including initializing the second PLL by: setting a phase-error accumulation of a digital phase detector (DPD) of the second PLL to zero; and setting an initial phase of the DPD of the second PLL to the stored initial phase value.

Example 9 is a phase locked loop (PLL) system, including a first PLL configured to generate a first signal; a second PLL configured to generate a second signal; and a phase calculation circuitry. The phase calculation circuitry is configured to: calculate a phase of the first signal at a given time; and provide the calculated phase to the second PLL for use by the second PLL in synchronizing a phase of the second with the phase of the first signal.

Example 10 includes the subject matter of example 9, including or omitting optional elements, wherein the phase calculation circuitry is configured to calculate the phase of the first signal at the given time independent of a measured phase of the first signal.

Example 11 includes the subject matter of examples 9-10, including or omitting optional elements, wherein the phase calculation circuitry is configured to calculate the phase of the first signal based at least on a ratio between a target frequency of the first signal and a frequency of a reference signal.

Example 12 includes the subject matter of example 11, including or omitting optional elements, wherein the phase calculation circuitry is configured to calculate the phase of the first signal at the given time by: determining an initial phase of the first signal with respect to a reference signal at a reset time; determining a phase offset by multiplying the ratio by a number of reference signal cycles occurring between the reset time and the given time; and adding the initial phase to the phase offset.

Example 13 includes the subject matter of examples 9-10, including or omitting optional elements, wherein the phase calculation circuitry is configured to store the calculated phase of the first signal at the given time in a register that is read by the second PLL upon start up.

Example 14 includes the subject matter of examples 9-10, including or omitting optional elements, wherein the second PLL is configured to, in response to receiving an instruction to start up the second PLL at a given time: read an instantaneous phase value, wherein the instantaneous phase value corresponds to a calculated phase at the given time of the first PLL; and initialize the second PLL based at least on the instantaneous phase value.

Example 15 includes the subject matter of examples 9-10, including or omitting optional elements, wherein the second PLL is configured to access a register to read the instantaneous phase value.

Example 16 includes the subject matter of examples 9-10, including or omitting optional elements, wherein the second PLL is configured to, in response to receiving an instruction to start up the second PLL at a given time, set a phase-error accumulation of a digital phase detector (DPD) of the second PLL to zero; and set an initial phase of the DPD of the second PLL to the stored initial phase value.

Example 17 is a phase calculation circuitry, configured to: calculate a phase of a first signal generated by a first phase locked loop (PLL) at a given time; and provide the calculated phase to a second PLL for use by the second PLL in synchronizing a phase of the second with the phase of the first signal.

Example 18 includes the subject matter of example 17, including or omitting optional elements, wherein the phase calculation circuitry is further configured to calculate the phase of the first signal based at least on a ratio between a target frequency of the first signal and a frequency of a reference signal.

Example 19 includes the subject matter of examples 17-18, including or omitting optional elements, wherein the phase calculation circuitry is configured to calculate the phase of the first signal at the given time by: determining an initial phase of the first signal with respect to a reference signal at a reset time; determining a phase offset by multiplying the ratio by a number of reference signal cycles occurring between the reset time and the given time; and adding the initial phase to the phase offset.

Example 20 includes the subject matter of examples 17-18, including or omitting optional elements, wherein the phase calculation circuitry is configured to store the calculated phase of the first signal at the given time in a register that is read by the second PLL upon start up.

Example 21 is an apparatus configured to synchronize a first phase locked loop (PLL) with a second PLL. The apparatus includes means for calculating a phase of a first signal at a given time, wherein the first signal is generated by the first PLL, wherein the calculating is performed independent of a measured phase of the first signal; and means for providing the calculated phase of the first signal at the given time to the second PLL for use by the second PLL in synchronizing a phase of a second signal generated by the second PLL with the first signal.

Example 22 includes the subject matter of example 21, including or omitting optional elements, wherein the means for calculating is configured to calculate the phase of the first signal based at least on a ratio between a target frequency of the first signal and a frequency of a reference signal.

Example 23 includes the subject matter of example 22, including or omitting optional elements, wherein the means for calculating is configured to calculate the phase of the first signal at the given time by: determining an initial phase of the first signal with respect to a reference signal at a reset time; determining a phase offset by multiplying the ratio by a number of reference signal cycles occurring between the reset time and the given time; and adding the initial phase to the phase offset.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method to synchronize a first phase locked loop (PLL) with a second PLL, comprising:
    determining an initial phase of a first signal with respect to a reference signal at a reset time, wherein the first signal is generated by the first PLL;
    determining a phase offset by multiplying a ratio between a target frequency of the first signal and a frequency of the reference signal by a number of reference signal cycles occurring between the reset time and a given time; and
    adding the initial phase to the phase offset to calculate a phase of the first signal at the given time; and
    providing the calculated phase of the first signal at the given time to the second PLL for use by the second PLL in synchronizing a phase of a second signal generated by the second PLL with the first signal.

2. The method of claim 1, comprising calculating the phase of the first signal at the given time independent of a measured phase of the first signal.

3. The method of claim 1, comprising storing the calculated phase of the first signal at the given time in a register that is read by the second PLL upon start up.

4. A method to synchronize a first phase locked loop (PLL) with a second PLL, comprising, in response to receiving an instruction to start up the second PLL at a given time:
    reading an instantaneous phase value, wherein the instantaneous phase value corresponds to a calculated phase at the given time of the first PLL; and
    setting a phase-error accumulation of a digital phase detector (DPD) of the second PLL to zero; and
    setting an initial phase of the DPD of the second PLL to the instantaneous phase value.

5. The method of claim 4, comprising accessing a register to read the instantaneous phase value.

6. A phase locked loop (PLL) system, comprising:
    a first PLL configured to generate a first signal;
    a second PLL configured to generate a second signal; and
    a phase calculation circuitry, configured to:
        calculate a phase of the first signal at a given time; and
        store the calculated phase of the first signal at the given time in memory that is read by the second PLL upon start up for use by the second PLL in synchronizing a phase of the second with the phase of the first signal.

7. The PLL system of claim 6, wherein the phase calculation circuitry is configured to calculate the phase of the first signal at the given time independent of a measured phase of the first signal.

8. The PLL system of claim 6, wherein the phase calculation circuitry is configured to calculate the phase of the first signal based at least on a ratio between a target frequency of the first signal and a frequency of a reference signal.

9. The PLL system of claim 8, wherein the phase calculation circuitry is configured to calculate the phase of the first signal at the given time by:
   determining an initial phase of the first signal with respect to a reference signal at a reset time;
   determining a phase offset by multiplying the ratio by a number of reference signal cycles occurring between the reset time and the given time; and
   adding the initial phase to the phase offset.

10. The PLL system of claim 6, wherein the phase calculation circuitry is configured to store the calculated phase of the first signal at the given time in a register that is read by the second PLL upon start up.

11. The PLL system of claim 6, wherein the second PLL is configured to, in response to receiving an instruction to start up the second PLL at a given time:
   read an instantaneous phase value, wherein the instantaneous phase value corresponds to a calculated phase at the given time of the first PLL; and
   initialize the second PLL based at least on the instantaneous phase value.

12. The PLL system of claim 6, wherein the second PLL is configured to access a register to read the instantaneous phase value.

13. The PLL system of claim 6, wherein the second PLL is configured to, in response to receiving an instruction to start up the second PLL at a given time:
   set a phase-error accumulation of a digital phase detector (DPD) of the second PLL to zero; and
   set an initial phase of the DPD of the second PLL to the initial phase value.

14. A phase calculation circuitry, configured to:
   calculate a phase of a first signal generated by a first phase locked loop (PLL) at a given time; and
   store the calculated phase in memory that is read by a second PLL upon startup for use by the second PLL in synchronizing a phase of the second with the phase of the first signal.

15. The phase calculation circuitry of claim 14, wherein the phase calculation circuitry is further configured to calculate the phase of the first signal based at least on a ratio between a target frequency of the first signal and a frequency of a reference signal.

16. The phase calculation circuitry of claim 15, wherein the phase calculation circuitry is configured to calculate the phase of the first signal at the given time by:
   determining an initial phase of the first signal with respect to a reference signal at a reset time;
   determining a phase offset by multiplying the ratio by a number of reference signal cycles occurring between the reset time and the given time; and
   adding the initial phase to the phase offset.

17. The phase calculation circuitry of claim 15, wherein the phase calculation circuitry is configured to store the calculated phase of the first signal at the given time in a register that is read by the second PLL upon start up.

* * * * *